US006799291B1

(12) United States Patent
Kilmer et al.

(10) Patent No.: US 6,799,291 B1
(45) Date of Patent: Sep. 28, 2004

(54) METHOD AND SYSTEM FOR DETECTING A HARD FAILURE IN A MEMORY ARRAY

(75) Inventors: Charles Arthur Kilmer, Essex Junction, VT (US); Shanker Singh, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 406 days.

(21) Appl. No.: 09/716,915

(22) Filed: Nov. 20, 2000

(51) Int. Cl.$^7$ ............................................... G11C 29/00
(52) U.S. Cl. .................... 714/722; 714/754; 714/823
(58) Field of Search ........................... 714/718, 7, 722, 714/752, 823, 742, 819, 799; 365/76, 182

(56) References Cited

U.S. PATENT DOCUMENTS

| | | |
|---|---|---|
| 3,944,800 A | 3/1976 | Beck et al. |
| 4,542,454 A | 9/1985 | Brcich et al. |
| 4,715,034 A * | 12/1987 | Jacobson ..................... 714/19 |
| 4,980,888 A | 12/1990 | Bruce et al. |
| 5,267,242 A * | 11/1993 | Lavallee et al. ............... 714/7 |
| 5,331,596 A | 7/1994 | Miyazawa et al. |
| 5,381,419 A | 1/1995 | Zorian |
| 5,467,314 A | 11/1995 | Miyazawa et al. |
| 5,506,959 A | 4/1996 | Cockburn |

OTHER PUBLICATIONS

"Buffer Memory with Detection of Data Errors and Errors Caused by Faults in the Read and Write Address Registers"; *Research Disclosure*, Jan. 1986, No. 261, Kenneth Mason Publications Ltd., England; 1 page.

"Syndrome/Check Bit Generator with Minimum Gate Delay"; IBM Technical Disclosure Bulletin, Dec. 1991, vol. 34, No. 7B; 2 pp.

* cited by examiner

*Primary Examiner*—Albert Decady
*Assistant Examiner*—Mujtaba Chaudry
(74) *Attorney, Agent, or Firm*—Randall J. Bluestone; Dillon & Yudell LLP (57) ABSTRACT

A method and system for detecting a failure in a dynamic random access memory (DRAM) array having a plurality of cells organized in a matrix fashion of rows and columns. The method includes reading the content of a first row of cells of the memory array during a first refresh cycle. After obtaining the content from the first row of cells, a first complement of the content is generated. The generated first complement is then written back to the first row of cells during the writeback operation of the first refresh cycle. During the subsequent refresh cycle, the first complement in the first row of cells is read and a second complement of the first complement is generated. Next, the original content in the first row of cells is compared with the second complement. In response to the original content not being equal to the second complement, a control signal is generated to indicate a failure in the memory array. In a related embodiment, the second complement is written back to the first row of cells during the subsequent refresh cycle writeback operation to restore the content in the first row of cells to its original value.

20 Claims, 6 Drawing Sheets

METHOD AND SYSTEM FOR DETECTING A HARD FAILURE IN A MEMORY ARRAY

CROSS REFERENCE TO RELATED APPLICATIONS

The present application is related to the following copending U.S. patent application Ser. No. 09/716,916 filed concurrently on Nov. 20, 2000, entitled "FAULT TOLERANT MEMORY SYSTEM UTILIZING MEMORY ARRAYS WITH HARD ERROR DEFECTION" and U.S. patent application Ser. No. 09/716,913 filed concurrently on Nov. 20, 2000, entitled "A HIGH PERFORMANCE FAULT TOLERANT MEMORY SYSTEM UTILIZING GREATER THAN FOUR-BIT DATA WORD MEMORY ARRAYS." The above mentioned patent applications are assigned to the assignee of the present application.

BACKGROUND OF THE INVENTION

1. Technical Field

The present invention relates in general to memory configurations for computing systems, and in-particular to fault detection. More specifically, the present invention relates to a method and system for detecting a hard memory array failure in a memory system.

2. Description of the Related Art

Memory systems employed in conventional data processing systems, such as computer systems, typically include large arrays of physical memory cells that are utilized to store information in a binary manner. Generally in a conventional memory system, the memory cells are arranged in an array having a set number of rows and columns. Operatively, the rows are selected by row decoders that are typically located adjacent to the ends of the row lines. Each of the row lines is electrically connected to the row decoders so that the appropriate signals can be received and transmitted. The columns of the memory array are connected to input/output (I/O) devices, such as a read/write multiplexer. In the case of dynamic random access memories (DRAMs), the memory array columns are also connected to line pre-charging and sense amplifier circuits at the end of each column line to periodically refresh the memory cells.

There are two kinds of errors that can typically occur in a memory system. The first is called a repeatable or "hard" error. For example, a piece of hardware that is part of the memory system, e.g., an interconnect, is broken and will consistently return incorrect results. A cell within a memory array may be stuck so that it always returns "0" for example, no matter what is written to it. Hard errors typically include loose memory modules contacts, electrically blown chips, motherboard defects or any other physical problems. These types of errors are relatively easy to diagnose and correct because they are consistent and repeatable. The second kind of error is called a transient or "soft" error. This occurs when a memory cell reads back the wrong value once, but subsequently functions correctly. These error conditions are, understandably, much more difficult to diagnose and are, unfortunately, more common. Eventually, a soft error may repeat itself, but may surface only after a lengthy period of time. These types of errors result, for example, from memory devices where some cells are marginally detective, alpha particle events hitting on the cell area, or other problems which are not related directly to the memory. The good news, however, is that the majority of soft errors due to alpha particles result in single bit errors.

To preclude corrupted data from use, encoding techniques are developed and employed in data processing systems to provide for detection and correction of errors. The simplest and most well-known error detection technique is the single-bit parity code. To implement a parity code, a single bit is appended to the end of the data word stored in memory. For even parity systems, the value of the parity bit is assigned a value such that the total number of ones in the stored word, including the parity bit, is even. Conversely, for odd parity, the parity bit is assigned such that the total number of ones is odd. When the stored word is read, if one of the bits is erroneous, the total number of ones in the word must change so that the parity value for the retrieved data does not match the stored parity bit. Thus, an error is detected by comparing the stored parity bit to a regenerated check bit calculated for the data word as it is retrieved from memory.

Although a single-bit parity code effectively detects single-bit read errors, the system has limits. For example, if there are two errors, the parity value for the data remains the same as the stored parity bit because the total number of ones in the word stays odd or even. In addition, even though an error may be detected, the single-bit parity code cannot determine which bit is erroneous, and therefore the failed memory cell cannot be identified or corrected.

To provide error correction and more effective error detection, various error correction codes were developed which not only determine that an error has occurred, but also indicate which bit is erroneous. The most well-known error correction code is the Hamming code, which appends a series of check bits to the data word as it is stored. When the data word is read, the retrieved check bits are compared to regenerated check bits calculated for the retrieved data word. The results of the comparison indicate whether an error has occurred, and if so, which bit is erroneous. By inverting the erroneous bit, the error is corrected. In addition, a Hamming code detects two-bit errors which would escape detection under a single-bit parity system. Hamming codes can also be designed to provide for three-bit error detection and two-bit error correction, or any other number of bit errors, by appending more check bits. Thus, Hamming codes commonly provide greater error protection than simple single-bit parity checks.

Unfortunately, Hamming codes require several check bits to accomplish the error detection and correction. For example, an eight-bit data word requires five check bits to detect two-bit errors and correct one-bit errors. As the bus grows wider and the number of bits of transmitted data increases, the number of check bits required also increases. Because modern memory buses are often 64 or 128 bits wide, the associated Hamming code would be very long indeed, requiring considerable memory space just for the check bits. However, for wider data words, the data to check bit ratio decreases. The check bit overhead, therefore, is smaller as compared to smaller data words.

A further problem is caused by modern random access memory (RAM) chips. In early memory systems, RAM chips were organized so that each chip provided one bit of data for each address. Current RAM chips, however, are frequently organized into sets of four bits of data for each address. If one of these RAM chips fails, the result is one to four potentially erroneous data bits. Unless the error correction code is designed for four-bit error detection, a four-bit error may go completely undetected. Incorporating a four-bit error detection (four-bit package error detection) and one-bit correction code in a 64-bit or 128-bit memory system, however, would require eight or nine check bits. Currently, a large percentage of memory array production is utilized in personal computers (PCs) and it is anticipated that in the following years through 2004, PCs will typically employ 32 MB to 256 MB memory systems.

Presently, memory arrays typically contain 256 Mbit devices and the trend is towards production of memory arrays that will contain 1 Gbit within two to four years. With the anticipated increase in memory array sizes, the present approach of utilizing 1 or 4 bit wide memory chip organization must be reconsidered. For example, employing the present 1 or 4 bit memory chip organization with a 32 bit wide data word will require 32 memory arrays (1 bit organization) or 8 memory arrays (4 bit organization). This will, in turn, result in a minimum granularity in a PC of 8 GB or 4 GB, respectively. This large amount of memory in a desktop or laptop computer is excessive and unnecessary and also has the added disadvantage of increasing the overall cost of the computer system. In response to the minimum granularity problem, memory array manufacturers are moving to 8, 16 and even 32 bit wide memory organization schemes with the corresponding increase in the number of check bits required for error detection and correction.

Accordingly, what is needed in the art is an improved error detection technique that mitigates the above-described limitations in the prior art. More particularly, what is needed in the art is an improved method for detecting hard failures in a memory array that utilizes memory organization schemes greater than 4 bit wide.

SUMMARY OF THE INVENTION

It is therefore an object of the invention to provide an improved memory system.

It is another object of the invention to provide a method and system for detecting failures in a memory array.

To achieve the foregoing objects, and in accordance with the invention as embodied and broadly described herein a method for detecting a hard failure in a dynamic random access memory (DRAM) array, wherein the memory array has a plurality of cells organized in a matrix fashion of rows and columns. The method includes reading the content of a first row of cells of the memory array during a first refresh cycle. After obtaining the content from the first row of cells, a first complement of the content is generated. The generated first complement is then written back to the first row of cells during the writeback operation of the first refresh cycle. During the subsequent refresh cycle, the first complement in the first row of cells is read and a second complement of the first complement is generated. Next, the original content in the first row of cells is compared with the second complement. In response to the original content not being equal to the second complement, a control signal is generated to indicate a failure in the memory array. In a related embodiment, the second complement is written back to the first row of cells during the subsequent refresh cycle writeback operation to restore the content in the first row of cells to its original value.

In another aspect of the present invention, a failure detection circuit for use with a memory system having at least one memory array and a data IN/OUT buffer coupled to the memory array is disclosed. The failure detection circuit includes an inverter and a register coupled to the data IN/OUT buffer. The failure detection circuit also includes a comparator, coupled to the inverter and register, for comparing the contents of the inverter and register. An error signal is generated in response to the contents not being equal to indicate a failed memory array. The failure detection circuit is utilized in conjunction with normally occurring refresh operations of the memory array to detect failures in the memory array. In a related embodiment, the memory array is a dynamic random access memory (DRAM).

The foregoing description has outlined, rather broadly, preferred and alternative features of the present invention so that those skilled in the art may better understand the detailed description of the invention that follows. Additional features of the invention will be described hereinafter that form the subject matter of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
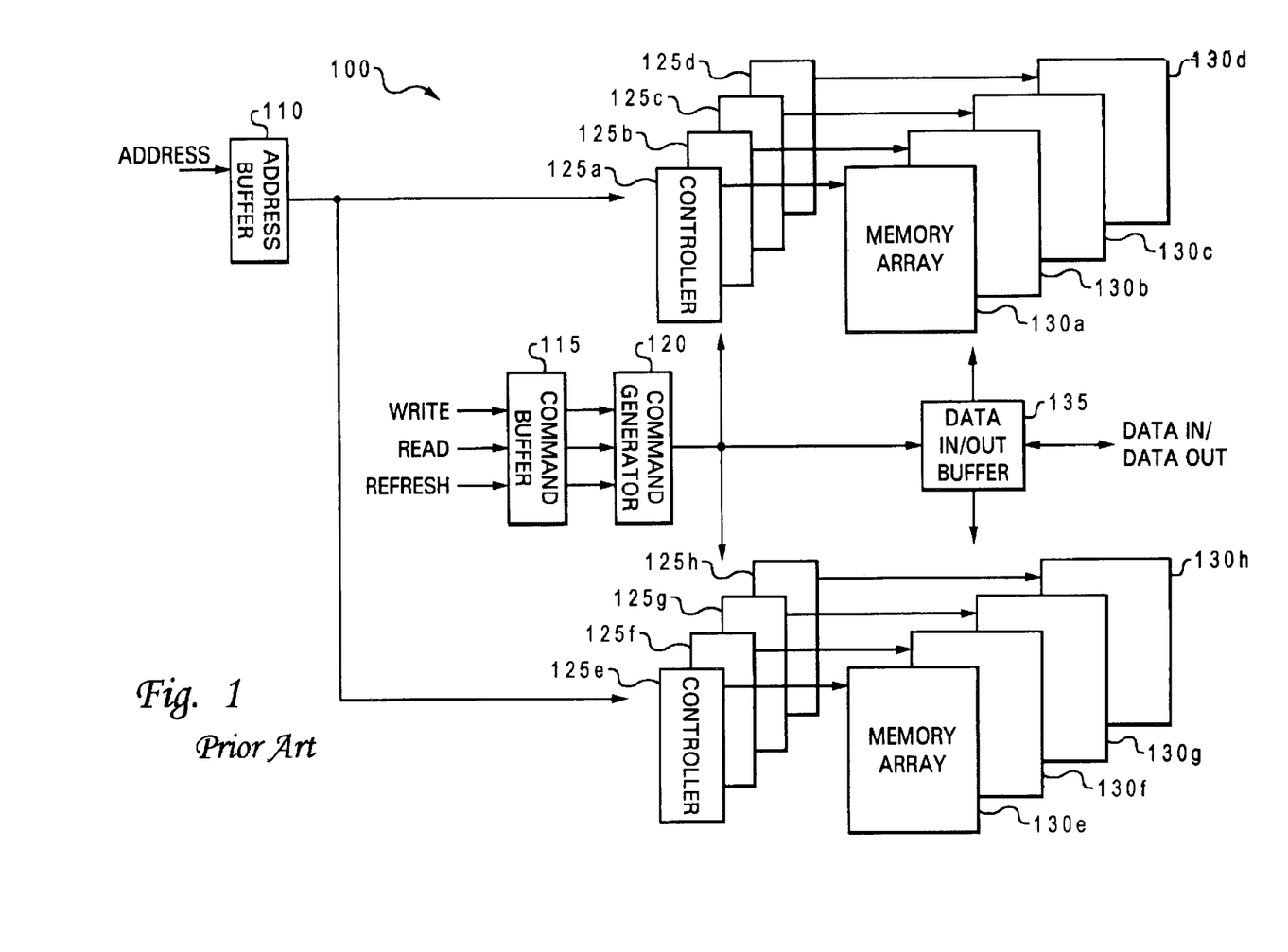
FIG. 1 illustrates an exemplary high-level simplified block diagram of a memory system that provides a suitable environment for the practice of the present invention.

With reference now to the figures, and in particular, with reference to FIG. 1, there is depicted an exemplary high-level simplified block diagram of a memory system 100 that provides a suitable environment for the practice of the present invention. Memory system 100 includes a plurality of memory arrays, generally designated 130$a$–130$h$, that are coupled to a corresponding plurality of memory array controllers, also designated 125$a$–125$h$, that provide word-line drivers (not shown) for memory arrays 130$a$–130$h$ containing memory cells (not shown). Memory arrays 130$a$–130$h$, in a preferred embodiment, are dynamic random access memories (DRAMs). Although memory system 100 is illustrated with eight independent memory arrays for simplicity, in another advantageous embodiment, memory system 100 is part of a data processing system, such as a personal computer, and is operated with sixteen independent memory arrays with a gigahertz central processing unit (CPU) clock in a fully pipelined fashion. It should be noted, however, that the present invention does not contemplate limiting its practice to any one particular size memory array or clock speed.

Generally, memory system 100 receives four external signals: one clock (not shown) and three commands, i.e., READ, WRITE and optionally REFRESH. It should be noted that the refresh command may be initiated, in other advantageous embodiments, internally within memory arrays 130a–130h. Memory system 100 also receives a multi-bit address signal at address buffer 110 and can typically generate a multiple bit output at data IN/OUT buffer 135 at every 1 ns clock cycle (assuming a gigahertz clock is utilized). The address of a data to be read is received at address buffer 110 and provided to the respective memory array controller. The READ, WRITE and REFRESH commands, on the other hand, are received at command buffer 115 and forwarded on to a command generator 120. Command generator 120 then proceeds to route the specified command to the respective memory array controller and to data IN/OUT buffer 135.

Figure 2A:
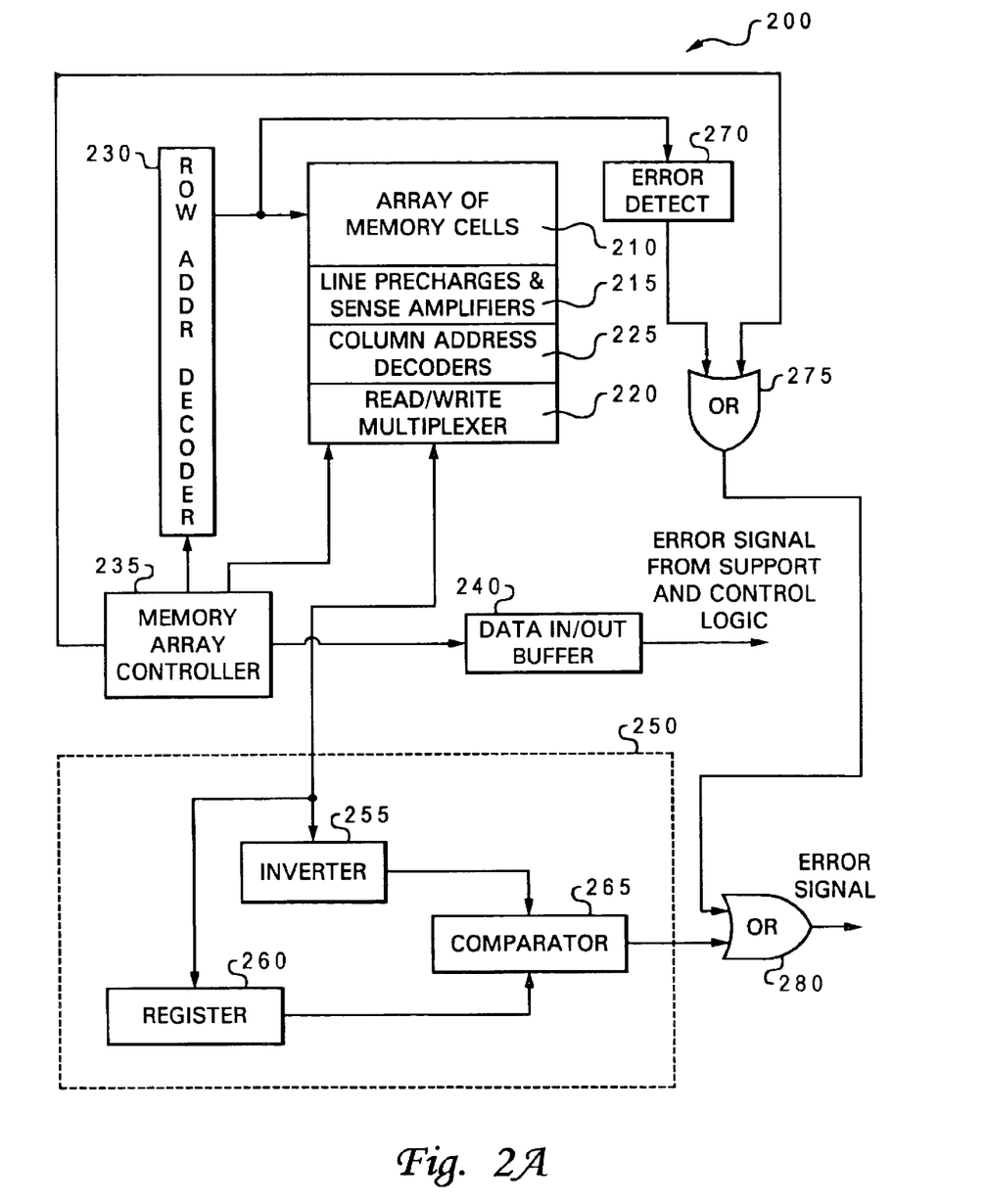
FIG. 2A illustrates a high-level block diagram of an exemplary memory array utilizing an embodiment of a failure detection circuit according to the principles disclosed by the present invention.

Referring now to FIG. 2A, there is illustrated a high-level block diagram of an exemplary memory array 200 utilizing an embodiment of a failure detection circuit 250 according to the principles disclosed by the present invention. Memory array 200 (analogous to memory arrays 130a–130h depicted in FIG. 1) includes a plurality of memory cells, generally designated 210, that are typically organized in an array fashion of rows and columns. Memory array 200 also includes line precharges and sense amplifiers 215 that are coupled to the end of end column of memory cells and are utilized to precharge a wordline (not shown). A memory array controller 235 controls the selection of which memory cells that are to be read or written through row and column address decoders 230, 225, respectively. A read/write multiplexer 215, coupled to a data in/out buffer 240, is utilized to selectively read or write data to the memory cells, depending on whether a READ or WRITE command was received by memory array controller 235.

Memory array 200 also includes a failure detection circuit 250 that includes an inverter 255 and a register 260 that are coupled to data in/out buffer 240. Inverter 255 and register 260 also provide inputs to a comparator 265. Comparator 265 is utilized to compare the two sets of data from inverter 255 and register 260 to generate an error signal in the event that the two sets of data are not identical. An error detection circuit 270 is also shown coupled to the output of row address decoder 230 and is utilize to monitor the operation of row address decoder 230. It should be noted that the support logic, such as column address decoders 225, data in/out buffers 240, etc., have self-checking logic and, in an advantageous embodiment, provide an error signal in response to detecting a failure in their respective circuits. An exemplary embodiment of error detection circuit 270 is depicted in FIG. 2B.

Figure 2B:
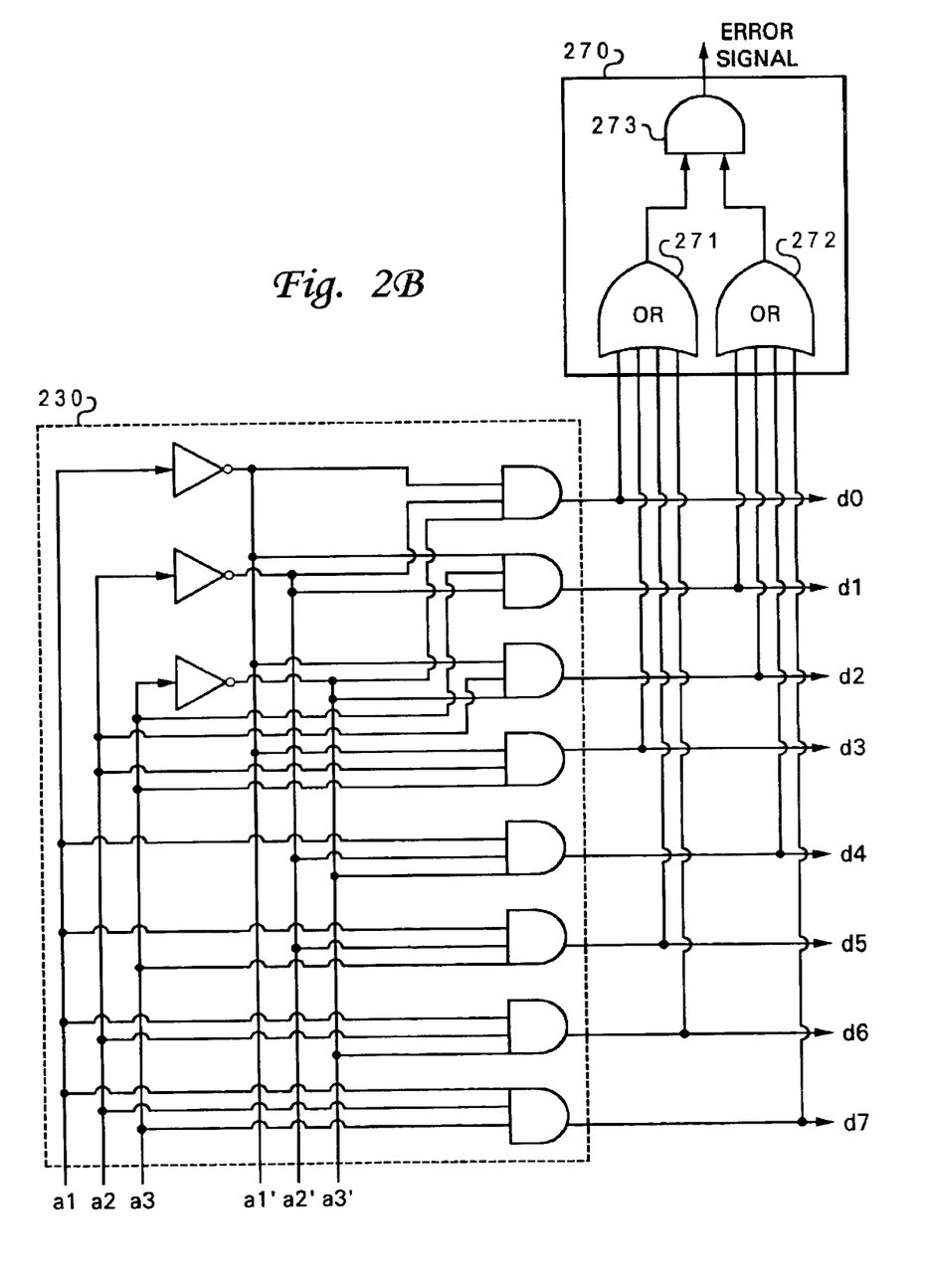
FIG. 2B illustrates an exemplary embodiment of the error detection circuit depicted in FIG. 2A.

Turning now to FIG. 2B, an embodiment of a three bit row address decoder 230 that generates eight address select signals d0 through d7 is shown coupled to error detection circuit 270. Row address decoder 230 includes three inverters that are utilized to generate the complements, i.e., a1', a2' and a3', of the three bit address signal (a1, a2 and a3). The address signal, along with its complement, are then selectively utilized as inputs to one of eight AND gates to generate the required row address select signal. To illustrate, an address signal of a1=0, a2=0 and a3=0 will select row address select signal d0. The remaining row addresses d1 through d7 correspond to address signals of 001, 010, 011, 100, 101, 110 and 111, respectively.

Error detection circuit 270 includes first and second OR logic gates 271, 272 whose outputs are utilized, in turn, as inputs to an AND logic gate 273. As shown in the illustrated embodiment, the inputs to first OR gate 271 are tied to address select signals d0, d3, d5 and d6 which correspond to "even parity" addresses, i.e., there is an even number of "1" bits in the three bit address. The remaining address select signals d1, d2, d4 and d7 (odd parity addresses) are utilized as inputs to second OR gate 272. Since only one address select signal will be high at any one time, a failure in row address decoder 230, e.g., a stuck bit, will result in another address select signal going high. Furthermore, the additional high signal will, in turn, result in driving both first and second OR gates 271, 272 high. With both inputs to AND gate 273 high, an high output from AND gate 273 will generate an error signal. To illustrate, assume an address signal of a1=0, a2=1 and a3=0 that will select address select signal d1 (odd parity) driving the output of second OR gate 272 high. Furthermore, assume a stuck bit in row address decoder 230 that results in the selection of a second address select signal d2, i.e., 011 (even parity). The selection of address select signal d2 will, in turn, will cause the output of first OR gate 271 to go high. Thus, with both outputs from first and second OR gates 271, 272 high, the output of AND gate 273 will also be driven high. It should be noted that error detection circuit 270 may also be advantageously utilized to provide a means for detecting failures in column address decoder 225.

Referring back to FIG. 2A, the output of error detection circuit 270, along with an error signal output from memory array controller 235 are utilized in a first OR gate 275 that consolidate both error signals in a single support and control logic error signal. The support and control logic error signal along with the error signal from failure detection circuit 250 are, in turn, utilized as inputs to a second OR gate 280 to provide a "chipkill" signal that indicates a hard failure in memory array 200. This chipkill signal, may then be employed by a system (not shown) utilizing memory array 200, such as personal computer, to initiate the necessary corrective measures.

Each memory cell in memory array 200 typically has a single transistor and a single capacitor. A data signal written into a memory cell is stored in its associated capacitor and the logic state of the data signal is determined by the charge level of the capacitor. The capacitor, however, will dissipate its charge over time and requires periodic refreshing to maintain its charge. The periodic refreshing of the memory cells is commonly known as a refresh cycle. The present invention utilizes the refresh cycles that are required to be performed in DRAMs along with failure detection circuit 250 to disclose a novel method for detecting a memory array failure. The operation of the present invention and, more particularly, failure detection circuit 250 will be described hereinafter in greater detail with respect to FIGS. 3, 4 and 5, with continuing reference to FIG. 2A.

Figure 3:
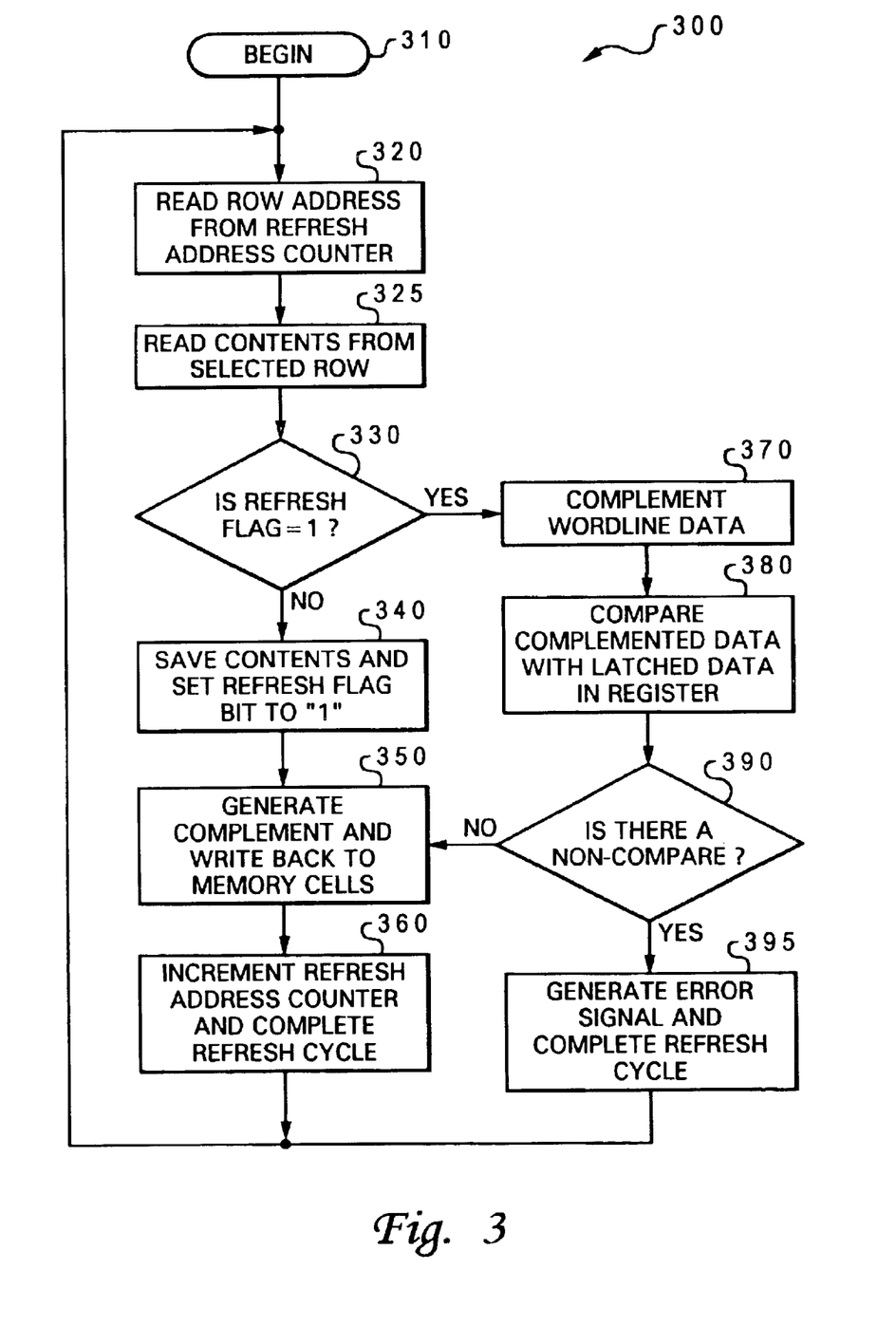
FIG. 3 illustrates a high-level flowchart of an embodiment of a failure detection process according to the principles disclosed by the present invention.

Referring now to FIG. 3, there is depicted a high-level flowchart of an embodiment of a failure detection process 300 according to the principles disclosed by the present invention. Process 300 is initiated, as illustrated in step 310, when a refresh operation is initiated by a preset timer, or alternatively, by a external command from a user. After the refresh has been initiated, the row address of a first row of cells in memory array 200 to be refreshed is obtained from a refresh address counter (not shown), as depicted in step 320. The refresh address counter is typically a part of memory array controller 235 and, unlike conventional refresh address counters, includes an additional bit, i.e., a refresh flag bit, designated to be the least significant bit (LSB) that provides a mechanism which will allow the selection of the same wordline, i.e., row of cells, twice in two sequential refresh cycles. For example, if the refresh flag bit is zero, this will indicate that the selected row of cells has not been read in the last refresh cycle. If the refresh flag bit is set to one, on the other hand, this will indicate that this particular row of cells has been read in the last refresh cycle. Similarly, the wordline has an additional bit, i.e., complement flag bit, to indicate whether the data is the original data or a complemented copy of the original data.

Next, the contents in a row of cells is read out to data in/out buffer 240, as depicted in step 325. As illustrated in decisional step 330, the refresh flag bit in the refresh address counter is evaluated to determine its content. If the refresh flag bit is set to zero, i.e., indicating that this is the first read operation for this particular row of cells, the contents in the selected row of cells are saved in register 260, as illustrated in step 340. Additionally, the refresh flag bit is next set to "1." In another advantageous embodiment, a segment of the wordline data is stored in register 260. It should be noted, however, that for n segments, the normal refresh rate would have to be increased n times. Next, as depicted in step 350, the wordline remains selected as the data is inverted at inverter 255 to generate a complement of the data. The complement of the data is then written back to the selected row of cells and the complement flag bit is toggled, i.e., if the complement flag bit is "0," it is changed to "1" and vice versa.

After the complemented data has been written back to the selected row of cells, the refresh address counter is incremented by one and the refresh cycle is completed as in a conventional DRAM refresh operation, as illustrated in step 360. Process 300 is then repeated at the issuance of the next refresh command, beginning at step 320.

Returning back to decisional step 330, if the refresh flag bit is set to "1" indicating that this is the second refresh of the same address, i.e., row of cells, the data on the wordline is complemented and the complement flag bit is toggled utilizing inverter 255, as depicted in step 370. Next, as illustrated in step 380, the complemented data from step 370 (designated X) is compared with the latched data (designated Y) stored in register 260, from the previous refresh operation of this row of cells, utilizing comparator 265. Subsequently, as depicted in decisional step 390, it is determined if the two sets of data, i.e., X and Y, are equal. The value of X should equal the value of Y because of the two intervening inversions. However, if memory array 200 has suffered a hard failure such that a bit, i.e., memory cell, has its output value stuck either high or low regardless of the value written to that memory cell, then X will not be equal to Y. In an advantageous embodiment, comparator 265 utilizes EXclusive OR (EXOR) logic to compare the two sets of data. In the event that the two sets of data are not equal, an error signal indicating a failed memory array is generated and the refresh cycle is completed as in a conventional DRAM refresh operation, as illustrated in step 395. Process 300 is then repeated at the issuance of the next refresh command, beginning at step 320.

On the other hand, if both sets of data are equal, process 300 resumes at step 350, where the data is inverted at inverter 255 to generate a complement of the data, thus restoring the data to its original value. The restored data is then written back to the selected row of cells and the complement flag bit is toggled to "0." After the restored data has been written back to the selected row of cells, the refresh address counter is incremented by one and the refresh cycle is completed as in a conventional DRAM refresh operation, as illustrated in step 360. Process 300 is then repeated for the next row of cells in memory array 200 at the issuance of the next refresh command, beginning at step 320.

It should be noted that an intervening READ or WRITE operation may occur between the first and second refresh cycles directed to the same row address of memory array 200. Accommodating these scenarios within the context of the present invention will be described with respect to FIGS. 4 and 5, with continuing reference to FIG. 2.

Figure 4:
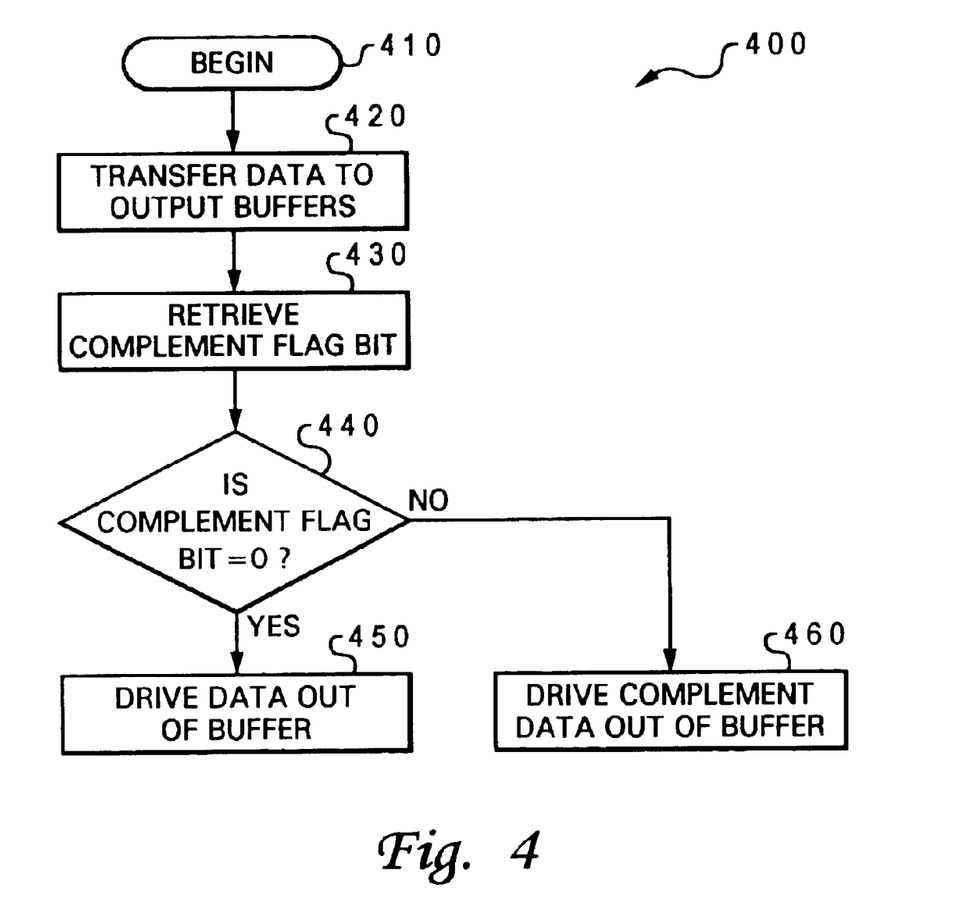
FIG. 4 illustrates a high-level process flow diagram of a READ operation to a memory array utilizing the principles disclosed by the present invention.

Referring to FIG. 4, illustrated is a high-level process flow diagram 400 of a READ operation to a memory array utilizing the principles disclosed by the present invention. Process 400 is initiated, as depicted in step 410, when a READ operation is directed at an address in memory array 200. As with a conventional DRAM, a wordline is selected in row address decoder 230 in response to the row addresses in the requested address signal and raised to a high-level. A bit-line pair are also brought at this time to about one-half (½) of a supply voltage Vdd. Next, sense amplifiers are turned on driving the sense amplifier driving signals high. Consequently, the small difference in voltages between the bit-line pair are amplified, so that one of the bit-line pair is driven high while the other bit-line is driven low. At this time, a data signal stored at the memory cell at the address requested is applied to the bit-line. This data signal is then amplified by the sense amplifiers and thereby applied to column address decoder 225 that ultimately transfers the data signal to data IN/OUT buffer 240, as illustrated in step 420.

While the data is being transferred to data IN/OUT buffer 240, the complement flag bit associated with the selected wordline is retrieved, as depicted in step 430. Next, as illustrated in decisional step 440, the retrieved complement flag bit is examined. In the event that the complement flag bit is "0," indicating the data residing in the selected row of memory cells is the original data, i.e., not complemented data, the data is transferred out of data IN/OUT buffer 240, as depicted in step 450. If, however, the complement flag bit is set to "1," i.e., the data residing in the selected row of memory cells is a complemented copy of the original data, the data is transferred to data IN/OUT buffer 240. Subsequently, the data is inverted and transferred out of data IN/OUT buffer 240, as depicted in step 460.

Figure 5:
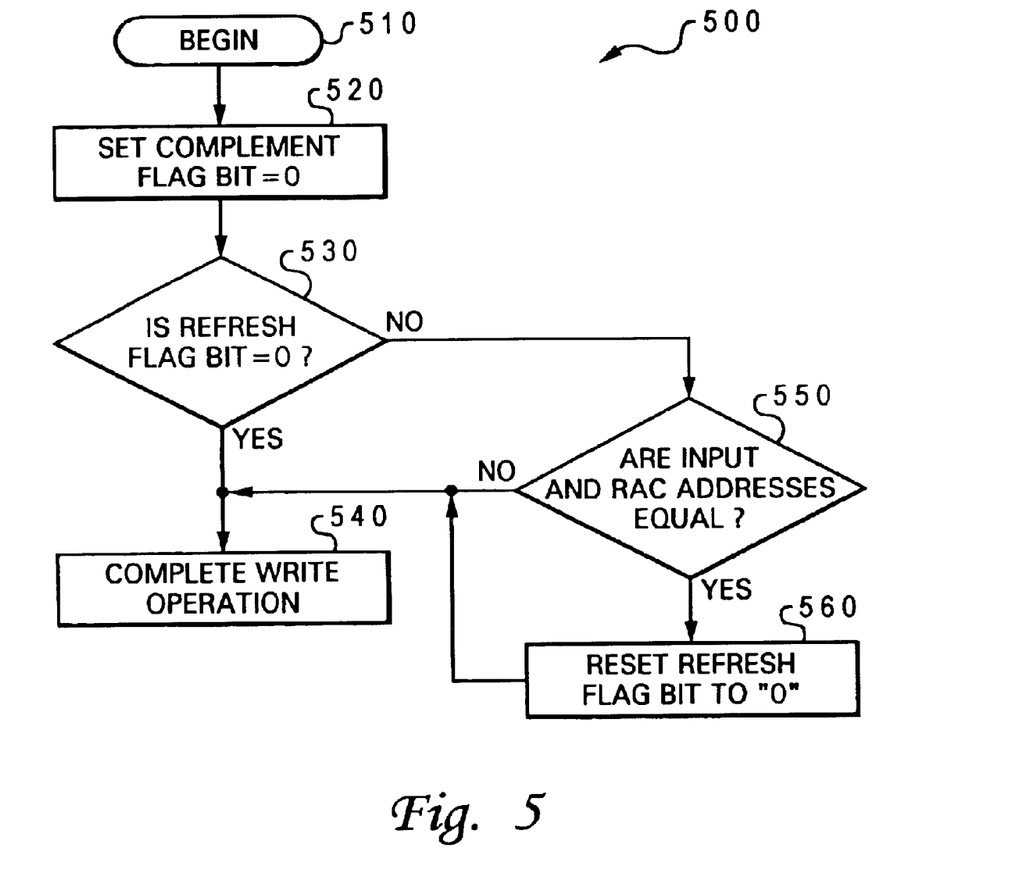
FIG. 5 illustrates a high-level process flow diagram of a WRITE operation to a memory array utilizing the principles disclosed by the present invention.

Referring now to FIG. 5, depicted is a high-level process flow diagram 500 of a WRITE operation to a memory array utilizing the principles disclosed by the present invention. Process 500 is initiated, as depicted in step 510, when a WRITE operation is directed at an address in memory array 200. The WRITE operation is similar to the READ operation described above except that data to be written in memory array 200 is applied at data IN/OUT buffer 240. Next, the complement flag bit in the wordline associated with the selected memory array is set to "0," as illustrated in step 520. After the complement flag bit has been set to "0," the refresh flag bit in the refresh address counter is examined, as depicted in decisional step 530. In the event that the refresh flag bit is "0," indicating that the next address in memory array 200 to be refreshed will be the first refresh of that address, i.e., the next refresh cycle will not perform the compare operation discussed above, process 500 completes the standard WRITE operation, as illustrated in step 540. In this case, a write signal is generated causing the input data at data IN/OUT buffer 240 to be multiplexed onto the appropriate column lines, and thus the data is written in the selected memory cells.

Returning back to decisional step 530, if the refresh bit is "1," the selected input address where data will be written to is compared to the address in the refresh address counter, as depicted in decisional step 550. If the selected WRITE address and the address in the refresh address counter are not the same, process 500 proceeds to step 540 (described above) where the input data is written in the selected memory cells. On the other hand, if the two addresses, i.e., selected WRITE address and address in the refresh address counter, are the same, the refresh flag bit in the refresh address counter is set to "0," i.e., the next refresh cycle will not perform the compare operation. After the refresh bit has been set to "0," process 500 proceeds to step 540 to complete the WRITE operation.

In another advantageous embodiment, processes 300, 400 and 500 may be implemented in a data processing system employing the memory system disclosed by the present invention and programmed to execute the method described hereinabove. Accordingly, in an advantageous embodiment, sets of instructions for executing the method disclosed herein are resident in RAM of one or more of the data processing system. These instructions may reside in various types of signal-bearing media. In this respect, one aspect of the present invention concerns a programmed product that includes signal-bearing media tangibly embodying a program of machine-readable instructions executable by a digital data processor to perform the error and detection method described above. The present invention does not contemplate limiting its practice to any particular type of signal-bearing media, i.e., computer readable medium, utilized to actually carry out the distribution. Examples of signal-bearing media includes recordable type media, such as floppy disks and hard disk drives, and transmission type media such as digital and analog communication links and wireless. In other advantageous embodiments, the computer program product may also be stored at another computer and transmitted to a user's computer system by an internal or external communication network, e.g., LAN or WAN, respectively.

It should be noted that although the present invention has been described, in one embodiment, in the context of a computer system, those skilled in the art will readily appreciate that the present invention is also capable of being distributed as a computer program product in a variety of forms; the present invention does not contemplate limiting its practice to any particular type of signal-bearing media, i.e., computer readable medium, utilized to actually carry out the distribution. Examples of signal-bearing media includes recordable type media, such as floppy disks and hard disk drives, and transmission type media such as digital and analog communication links.

While the invention has been particularly shown and described with reference to a preferred embodiment, it will be understood by those skilled in the art that various changes in form and detail may be made therein without departing from the spirit and scope of the invention.

What is claimed is:

1. A method for detecting a failure in a dynamic random access memory (DRAM) array, wherein said memory array has a plurality of cells organized in a plurality of rows and columns, said method comprising:
    reading a content of a first row of cells during a first refresh cycle;
    saving said content of said first row of cells in a register;
    generating a first complement of said content and writing said first complement back to said first row of cells during a first refresh cycle write-back operation;
    setting a refresh flag bit in a refresh address counter;
    reading said first complement from said first row of cells during a subsequent refresh cycle and generating a second complement of said first complement;
    writing back said second complement to said first row of cells during said subsequent refresh cycle writeback operation;
    comparing said content of said first row of cells with said second complement; and
    generating a control signal, in response to said content not being equal to said second complement, to indicate a failed memory array.

2. The method as recited in claim 1, wherein said comparing includes Exclusive ORing (EXOR) the results of said read of said first complement with said first complement of said content.

3. The method as recited in claim 2, wherein said control signal indicating a failed memory array is generated in response to said EXclusive ORing producing a non-zero result.

4. The method as recited in claim 1, wherein said first and subsequent refresh cycles are initiated with an external command.

5. The method as recited in claim 1, wherein said generating a first complement of said content includes setting a complement flag bit in a wordline associated with said memory array.

6. A failure detection circuit for use with a memory system having at least one memory array and a data IN/OUT buffer coupled to said at least one memory array, said failure detection circuit comprising:
    an inverter coupled to said data IN/OUT buffer;
    a register coupled to said inverter and said data IN/OUT buffer;
    a complement flag bit in a wordline associated with said at least one memory array;
    a comparator, coupled to said inverter and said register, for comparing contents of said inverter and said register and generating an error signal in response to said contents not being equal to indicate a failed memory array; and
    wherein said failure detection circuit is utilized in conjunction with refresh operations of said at least one memory array to detect a failure in said at least one memory array.

7. The failure detection circuit as recited in claim 6, wherein said at least one memory array is a dynamic random access memory (DRAM).

8. The failure detection circuit as recited in claim 6, further including a refresh flag bit in a refresh address counter.

9. The failure detection circuit as recited in claim 6, wherein said refresh operations includes logic for performing two refresh operations consecutively for each row of cells in said at least one memory array.

10. The failure detection circuit as recited in claim 6, wherein said comparator is an EXclusive OR (EXOR) logic circuit.

11. A memory system, comprising:
    a plurality of memory arrays;
    a plurality of memory army controllers, wherein each of said plurality of memory array controllers associated with one of said plurality of memory arrays;
    a data IN/OUT buffer coupled to said plurality of memory arrays;
    a refresh flag bit in each of a plurality of refresh address counters associated with each of said plurality of memory arrays; and
    a failure detection circuit, coupled to said data IN/OUT buffer, wherein said failure detection circuit is utilized in conjunction with refresh operations of said plurality of memory arrays to detect failures in said plurality of memory arrays, said failure detection circuit including:
        an inverter;
        a register; and
        a comparator, coupled to said inverter and said register, for comparing contents of said inverter and said register and generating an error signal in response to said contents not being equal to indicate a failed memory array.

12. The memory system as recited in claim 11, wherein said plurality of memory arrays are dynamic random access memories (DRAMs).

13. The memory system as recited in claim 11, wherein said failure detection circuit further includes a complement flag bit in each of a plurality of wordlines associated with each of said plurality of memory arrays.

14. The memory system as recited in claim 11, wherein said refresh operations includes performing two refresh operations consecutively for each row of cells in said plurality of memory arrays.

15. The memory system as recited in claim 11, wherein said comparator is an EXclusive OR (EXOR) logic circuit.

16. A computer program product, comprising:
a computer-readable medium having stored thereon computer executable instructions for implementing a method for detecting a failure in a dynamic random access memory (DRAM) array, wherein said memory array has a plurality of cells organized in a plurality of rows and columns, said computer executable instructions when executed, perform:
reading content of a first row of cells during a first refresh cycle;
saving said content of said first row of cells in a register;
generating a first complement of said content and writing said first complement back to said first row of cells during said first refresh cycle write-back operation;
setting a complement flag bit in a wordline associated with said memory array;
reading said first complement from said first row of cells during a subsequent refresh cycle and generating a second complement of said first complement;
saving said content of said first row of cells in a register;
writing back said second complement to said first row of cells during said subsequent refresh cycle write-back operation;
comparing said content of said first row of cells with said second complement; and
generating a control signal, in response to said content not being equal to said second complement, to indicate a failed memory array.

17. The computer program product as recited in claim 16, wherein said comparing results of said read of said first complement with said first complement of said content includes EXclusive ORing (EXOR) the results of said read of said first complement with said first complement of said content.

18. The computer program product as recited in claim 17, wherein said control signal indicating a failed memory array is generated in response to said EXclusive ORing producing a non-zero result.

19. The computer program product as recited in claim 16, wherein said first and subsequent refresh cycles are initiated with an external command.

20. The computer program product as recited in claim 16, wherein said computer executable instructions for generating a first complement of said content includes setting a refresh flag bit in a refresh address counter.

* * * * *

UNITED STATES PATENT AND TRADEMARK OFFICE
CERTIFICATE OF CORRECTION

PATENT NO. : 6,799,291 B1
DATED : September 28, 2004
INVENTOR(S) : Kilmer et al.

It is certified that error appears in the above-identified patent and that said Letters Patent is hereby corrected as shown below:

Column 10,
Lines 49-53, please replace with the following:
-- 11. A memory system, comprising:
   a plurality of memory arrays;
   a plurality of memory array controllers, wherein each of said
      plurality of memory array controllers associated with one of
      said plurality of memory arrays; --.

Signed and Sealed this

Twenty-fifth Day of October, 2005

JON W. DUDAS
*Director of the United States Patent and Trademark Office*